US009599656B2

(12) United States Patent
Uppal et al.

(10) Patent No.: US 9,599,656 B2
(45) Date of Patent: Mar. 21, 2017

(54) METHODS, APPARATUS AND SYSTEM FOR VOLTAGE RAMP TESTING

(71) Applicants: GLOBALFOUNDRIES INC., Grand Cayman, KY (US); International Business Machines Corporation, Armonk, NY (US)

(72) Inventors: Suresh Uppal, Clifton Park, NY (US); Andreas Kerber, Mount Kisco, NY (US); William McMahon, Scarsdale, NY (US); Eduard A. Cartier, New York, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 323 days.

(21) Appl. No.: 14/553,863

(22) Filed: Nov. 25, 2014

(65) Prior Publication Data

US 2016/0146879 A1 May 26, 2016

(51) Int. Cl.
*G01R 31/00* (2006.01)
*G01R 31/14* (2006.01)
*G01R 31/28* (2006.01)

(52) U.S. Cl.
CPC ......... *G01R 31/14* (2013.01); *G01R 31/2879* (2013.01)

(58) Field of Classification Search
CPC  G01R 31/2879; G01R 31/14; G01R 31/2607; G01R 31/2851; G01R 31/28; G01R 31/26
See application file for complete search history.

(56) References Cited

U.S. PATENT DOCUMENTS

| | | | | |
|---|---|---|---|---|
| 2004/0104731 A1* | 6/2004 | Vollertsen | .......... | G01R 31/2879 324/551 |
| 2005/0287684 A1* | 12/2005 | Howland, Jr. | ....... | G01R 31/129 438/17 |
| 2008/0290889 A1* | 11/2008 | Hillard | ............... | G01R 31/2648 324/755.11 |

* cited by examiner

*Primary Examiner* — Tung X Nguyen
(74) *Attorney, Agent, or Firm* — Williams Morgan, P.C.

(57) ABSTRACT

At least one method and system disclosed herein involves testing of integrated circuits. A device having at least one transistor and at least one dielectric layer is provided. A first voltage is provided during a first time period for performing a stress test upon the device. A second voltage is provided during a second time period for discharging at least a portion of the charge built-up as a result of the first voltage. The second voltage is of an opposite polarity of the first voltage. A sense function is provided during a third time period for determining a result of the stress test. Data relating to a breakdown of the dielectric layer based upon the result of the stress test is acquired, stored and/or transmitted.

20 Claims, 6 Drawing Sheets

METHODS, APPARATUS AND SYSTEM FOR VOLTAGE RAMP TESTING

BACKGROUND OF THE INVENTION

Field of the Invention

Generally, the present disclosure relates to the manufacture of sophisticated semiconductor devices, and, more specifically, to various methods of testing integrated circuits using voltage ramp signal to determine the effects of various processes upon the reliability of the circuits.

Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS and as well as metal insulator semiconductor (MIS) technologies are currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Generally, MOS technology involves forming a poly/metal gate, as well as dielectric and semiconductor substrates.

Various processes are performed on semiconductor substrates in manufacturing integrated circuit products. When integrated circuits are formed, tests are performed to determine the correctness in the operation of the circuits. Manufacturers generally perform various tests to determine the effects of the various processes on the performance and reliability of the circuits. Various quality or performance criterions may be used in determining whether the integrated circuits meet quality standards.

Dielectric weakening and/or failure with respect to time, temperature, and/or voltage are major concerns with regard to reliability failure of circuits manufactured using current semiconductor technology. In some instances, defects during processing can lead to dielectric failure (e.g., time dependent dielectric breakdown (TDDB) failure mechanism), or a parametric shift known as bias temperature instability (BTI) failure mechanism, either of which may result in a decrease in the overall reliability of the semiconductor devices. Process problems may affect the characteristics of the transistors and/or may cause weakening or failure of dielectric, which may lead to problems such as loss of integrity of the gate of a transistor. Therefore, tests to check various failure mechanisms are performed for testing the reliability of the integrated circuits. Two exemplary tests performed to determine the dielectric failure prospects are: a TBBD test and a BTI test.

The TDDB test relates to determining when a circuit portion, such as the gate of a MOSFET device, breaks down. This may be caused by weakness in portions of the dielectric. A determination may be made as to when the dielectric part of the circuit portion breaks down at certain particular current-levels, voltage levels, and/or temperature levels. In the example of a MOSFET, the breakdown would keep the gate of the MOSFET from operating properly as a switch that could control the current flow through the source and the drain of the MOSFET.

The BTI test relates to determining a shift in linear and saturation threshold voltages and/or linear and saturation currents, for example, of a transistor. In some cases, due to contamination during process, or due to other process problems, the threshold voltage may shift to a higher voltage. In this case, a higher voltage would be required to turn on, for example, a gate of a transistor. In addition, with continuous usage of a product (i.e., integrated chip), the MOSFET device may suffer degradation of its characteristics (e.g., threshold voltage, linear current, saturation current, etc.) due to time, temperature and/or voltages, etc. The BTI test may reveal whether the amount of shift (at time zero or within the lifetime of the product) in the linear and saturation threshold voltages, linear current, and/or saturation current would cause operational problems in a component, such as a transistor.

A voltage ramp stress (VRS) test may be used to perform tests such as TDDB and BTI tests. For testing, a stress voltage is supplied to the gate and/or substrate while other terminals are grounded, wherein the stress voltage is ramped up in steps. The VRS test signal may contain intermediate monitoring steps for verification of dielectric breakdown. The dielectric breakdown may be determined from monitoring current and/or stress current. As an example, in processes involving metal-gate/High-k stack (MG/HK), fast process screening is important due to the introduction of new materials, resulting in enhanced process complexity and generating new instability such as the positive-bias temperature instabilities. Tests using VRS signals may also be used to assess dielectric breakdown for conventional ultrathin SiON gate dielectrics with poly-Si electrodes.

FIG. 1 illustrates a prior art VRS test signal used testing integrated circuits, such as a TDDB test or a BTI test. FIG. 1 illustrates two graphs (202 and 204). Graph 202 plots a stress voltage signal 230 applied to the gate of a transistor, with respect to time. Graph 204 illustrates the corresponding drain voltage ($V_D$) or source voltage ($V_S$) during that time. Graph 202 shows a voltage applied to the gate in a step-wise manner, increasing up to the pre-step 210 level. Prior to starting the stress voltage, a reference drain current ($I_{Id}$) and a reference gate current ($I_{Ig}$) may be measured. These reference currents (before and after the stress cycles) may be compared to actual sensed currents in order to check the threshold and/or saturation current integrity.

At the start time $t_{start}$, a stress voltage is provided to the gate, wherein the value of the stress voltage is above the gate sense voltage ($V_{G\_sense}$). The application of the stress voltage is brought back to the $V_{G\_sense}$ level for performing the sensing function. Subsequently, a stepped-up stress voltage is applied, followed by bringing the stress voltage back to the $V_{G\_sense}$ level. This stepwise increase is repeated until a pre-defined voltage, $V_{stop}$, a predetermined amount of parametric shift, or stop time, $t_{stop}$. The stress voltage signal 230 rises in steps 220. The time period of the stress voltage applied at each step is stress time ($t_{stress}$) 240. The time period of the sensing function, wherein the stress voltage is brought down to the $V_{G\_sense}$ level is the sense time ($t_{sense}$) 250. Based upon performing the stress and sense function, the shift in the threshold voltage, linear current, and/or saturation current of a transistor may be determined. Moreover, there may be variants for the drain voltage, i.e., various levels of the drain voltage, wherein the drain voltage may be in provided in steps or in a continuous mode.

Among the disadvantages of state-of-the-art techniques include a build-up of charge during the stress portion ($t_{stress}$) due to the stress voltage. This may cause instability in the integrated circuit under test. In some cases, excessive charge may enter the bandgap. The built-up charge may also cause a permanent shift of the threshold voltages of transistors. Moreover, current BTI testing using VRS signals are generally not able capable of capturing the impact of opposite charge trapping. This problem could result in incorrect split signature for BTI testing.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for testing of integrated circuits. A device having at least one transistor and at least one dielectric layer is provided. A first voltage is provided during a first time period for performing a stress test upon the device. A second voltage is provided during a second time period for discharging at least a portion of the charge built-up as a result of the first voltage. The second voltage is of an opposite polarity of the first voltage. A sense function is provided during a third time period for determining a result of the stress test. Data relating to a breakdown of the dielectric layer based upon the result of the stress test is acquired, stored and/or transmitted.

BRIEF DESCRIPTION OF THE DRAWINGS

The disclosure may be understood by reference to the following description taken in conjunction with the accompanying drawings, in which like reference numerals identify like elements, and in which.

Figure 1:
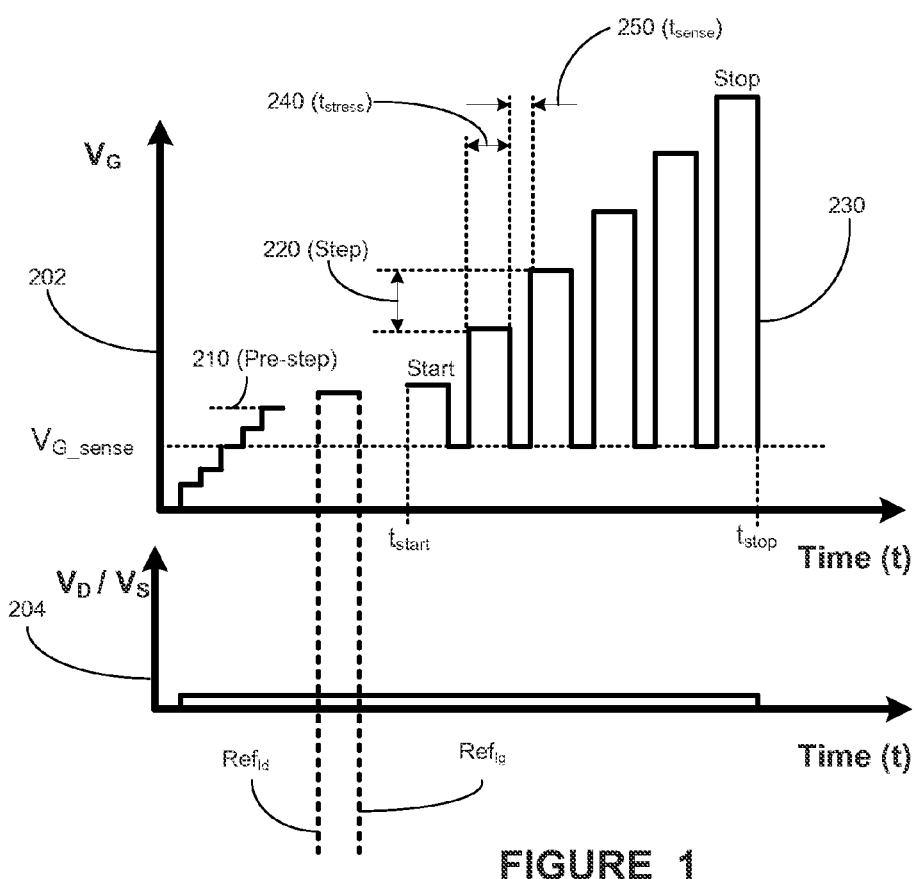
FIG. 1 depicts an illustrative example of a prior art VRS signal used for testing integrated circuits.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a reliability test upon integrated circuits manufactured by a semiconductor device processing system. The processing output, i.e., the integrated circuits/devices, may be tested for reliability and operational integrity. Results of these tests may be used in a learning cycle, which includes analyzing test data, and providing feedback for adjustments in the processing of the integrated circuits, determining a process split between a plurality of process sets, etc.

In some instances, integrated circuits may contain characteristics that may lead to weakness of the dielectric leading to TDDB failure, or may lead to a change in parametrics, leading to BTI failure mechanism. Embodiments herein provide for performing testing of integrated circuits using a VRS signal that comprises a feature for reducing or negating charge built-up during the stress portion of the VRS test signal. Upon providing a stress voltage during a stress time period, a voltage of the opposite polarity may be provided after the stress time period (i.e., during the sense time period) to compensate for, or to negate, the charge built up due to the stress voltage. In this manner, the sensing process may be performed substantially unadulterated by charges built-up by the stress voltage.

In one embodiment, upon providing the stress voltage during the stress time period, prior to performing a sensing function, a voltage of the opposite polarity (i.e., "recovery voltage") sufficient to substantially negate or reduce the charge built-up during the stress time period is provided. Subsequently, a sensing function may be performed.

In an alternative embodiment, a dual sensing process may be performed during the sense time period. Upon providing the stress voltage during the stress time period, prior to providing the recovery voltage, a first sense process is performed. Subsequently, after providing the recovery voltage, a second sensing process is performed. In this manner, the amount of charge removed may be determined.

Figure 2:
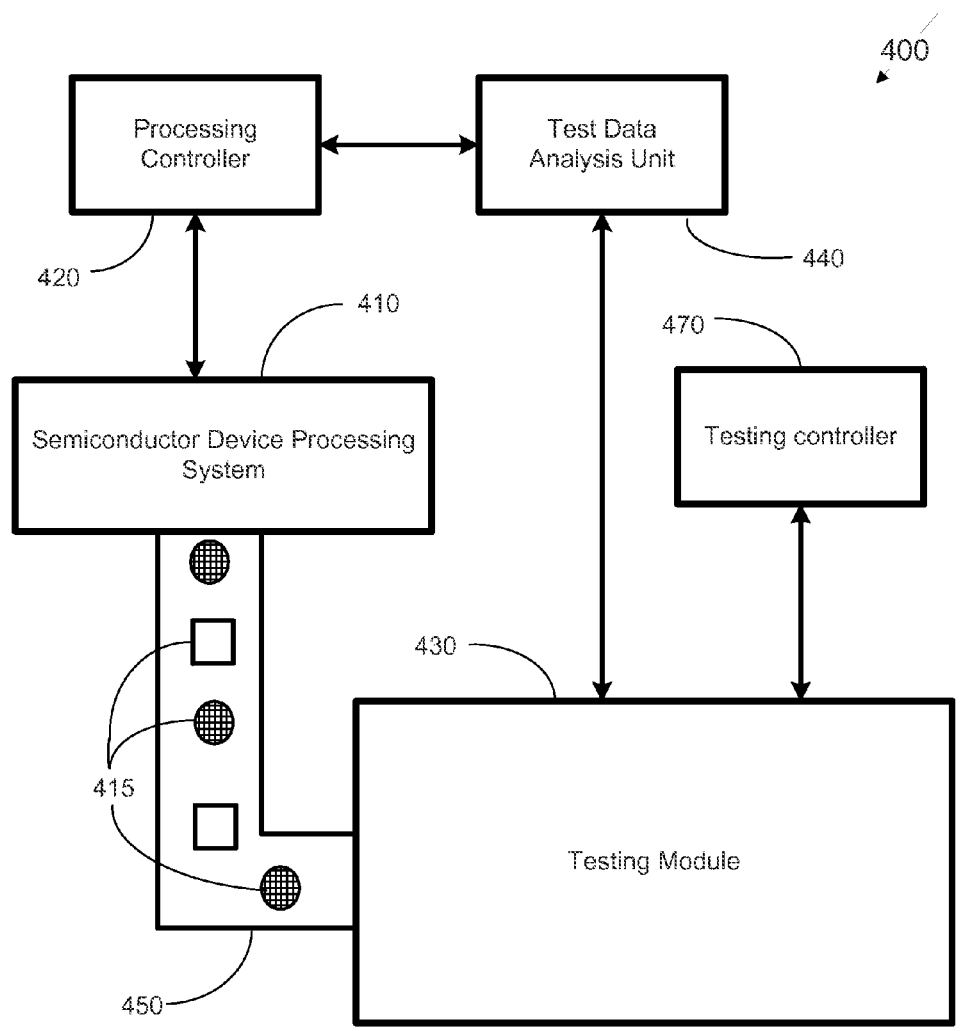
FIG. 2 illustrates a stylized block diagram depiction of a system in accordance with some embodiments herein.

Turning now to FIG. 2, a stylized block diagram depiction of a system in accordance with some embodiments herein, is illustrated. The system 400 may comprise a semiconductor device processing system 410. The semiconductor device processing system 410 may comprise various processing stations, such as etch process stations, photolithography process stations, CMP process stations, etc. One or more of the processing steps performed by the processing system 410 may be controlled by the processing controller 420. The processing controller 420 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 410 may produce integrated circuits on a medium, such as silicon wafers. The processing system 410 may provide processed integrated circuits/devices 415 on a transport mechanism 450, such as a conveyor system. In some embodiments, the conveyor system may be sophisticated clean room transport systems that are capable of transporting semiconductor wafers. In one embodiment, the semiconductor device processing system 410 may comprise a plurality of processing sets, e.g., the $1^{st}$ process step, the $2^{nd}$ process set, etc., as described above.

In some embodiments, the items labeled "415" may represent individual wafers, and in other embodiments, the items 415 may represent a group of semiconductor wafers, e.g., a "lot" of semiconductor wafers. In some embodiments, the feedback provided by the testing module 430 may not be on an immediate, wafer-to-wafer basis, but may be based upon a lot-to-lot basis. The testing module 430 may also be capable of determining a change from one wafer to another within a lot. In many embodiments, the testing module provides test data that may be used by the processing controller 420 to modify one or more process parameters relating to a subsequent lot of semiconductor wafers.

The processed integrated circuits 415 may be provided to a testing module 430 for performing various tests. The integrated circuit/device 415 may comprise a plurality of transistors and at least one dielectric layer. In one embodiment, the dielectric layer may be comprised of silicon dioxide, silicon nitride, siliconoxynitride, or a material having a dielectric constant. The integrated circuit or device 415 may be a transistor, a capacitor, a resistor or a memory cell. In one embodiment, the device 415 is a transistor and the dielectric layer is a gate insulation layer for the transistor.

The testing module 430 may comprise one or more test portions that are capable of performing various dielectric tests upon the integrated circuits. These tests may include, but are not limited to BTI testing TDDB testing, hop carrier testing, etc. The testing module 430 is capable of providing test signals that comprises a recovery voltage portion for substantially negating built-up charge during the stress portion of the test. The testing module 430 may provide for a dual sensing process that performs sensing prior to, as well as after an application of a recovery voltage.

In some embodiments, the testing module 430 is capable of detecting various breakdown characteristics of the integrated circuit under test. The testing module 430 is also capable of detecting various threshold shift characteristics of the integrated circuit under test. In one embodiment, the testing module 430 is capable of providing test data relating to a breakdown of a dielectric layer of the device under test and/or at least one characteristic of a transistor of the device. The testing module 430 may use test data in order to compare the degradation of the linear and saturation drain currents, as well as the linear and saturation threshold voltages, and/or other electrical parameters.

Test data from the tests performed by the testing module 430 may be provided to the test data analysis unit 440. The test data analysis unit 440 may determine whether the breakdown data indicates that breakdown values are above a predetermined breakdown reference or threshold. Similarly, the test data analysis unit 440 may determine whether the shift in the threshold voltage(s) is not above a corresponding shift reference or threshold values. In one embodiment, these comparisons may be made using look-up functions involving stored data in the system 400 and/or comparison with off-line data. In other embodiments, the determinations with regard to the breakdown values and the threshold shift values may be based upon manual input from external sources.

The testing module 430 may be controlled by the testing controller 470. Although, in one embodiment, the testing controller 470 is depicted as being external to the testing module 430, in an alternative embodiment, the testing module 470 may be within the testing module 430. The testing controller 470 may be a workstation computer, a desktop computer, a laptop computer, a tablet computer, or any other type of computing device comprising one or more software products that are capable of controlling operations of the testing module 430.

Data from the testing module is received, processed, correlated, and/or stored by the test data analysis unit 440. Data from the test data analysis unit 440 may be provided to the processing controller 420. This data may be used by the processing controller 420 to perform adjustments to subsequent processes performed by the processing system 410, and/or provide information for selecting a particular process set based upon the test data results. In this manner, a feedback process may be performed based upon the learning cycle of the liability testing performed by the testing module 430. This feedback may affect various parameters used to perform processing of integrated circuits and/or selecting particular processes for manufacturing integrated circuits. For example, data from the test data analysis unit 440 may be provided to the processing controller 420. The processing controller 420 may then use this data to adjust one or more process parameters, and/or make a selection of a processing set from a plurality of processing sets. Examples of the process parameter may include, but are not limited to, a temperature, a pressure, a duration, a process gas composition, a process gas concentration, an applied voltage of a process operation, or the like.

The system 400 may be capable of performing analysis for various products involving various technologies. For example, the system 400 may provide test data for CMOS technology, Flash technology, BiCMOS technology, power devices, memory devices (e.g., DRAM devices), NAND memory devices, and/or various other semiconductor technologies.

Figure 3:
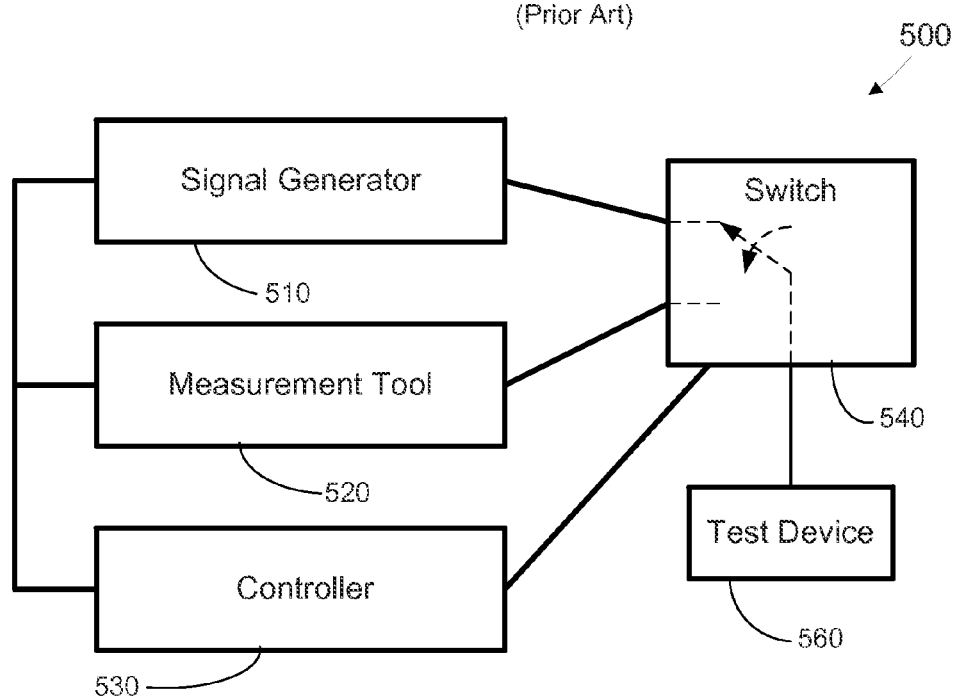
FIG. 3 depicts an illustrative test system that may be employed in accordance with the present invention to evaluate the reliability of dielectric layers.

FIG. 3 depicts an illustrative test system 500 that may be employed in accordance with the present invention to evaluate the reliability of dielectric layers. In one embodiment, the test system 500 is a portion of the testing module 430. The test system is capable of providing test signals in accordance with embodiments herein, such as the signals exemplified in FIGS. 4 and 7 (described below).

Figure 5:
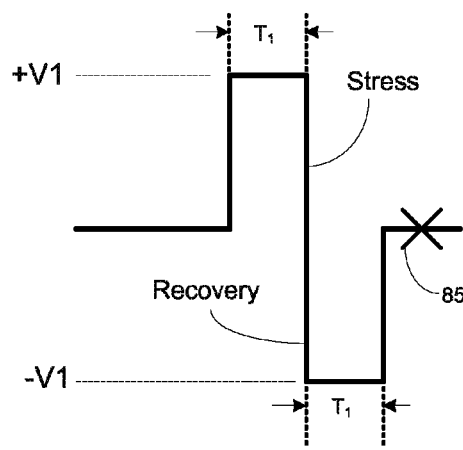
FIG. 5 illustrates a stylized depiction of a portion of the ramping signal for performing a dielectric testing of an integrated device, in accordance with a first embodiment.

In general, the test system 500 is comprised of a signal generator 510, a measurement tool 520 (e.g., a stress-induced current and voltage measurement tool), a switch 540, and a controller 530. It should be understood that the test device 560 depicted in FIG. 5 is representative in nature of many such devices, e.g., hundreds or thousands, that may be subjected to such testing in order to acquire enough data to make reliable assessments regarding the reliability of the dielectric layers tested. Typically, the test device 560 is a test structure that is formed on a semiconducting substrate, e.g., an SOI substrate or a bulk silicon substrate. However, in some cases, it may be possible to perform the testing described herein on actual production devices, although modifications may have to be made due to the complexity of the completed devices.

The signal generator 510 is capable of providing various voltage signals for performing the BTI and TDDB tests described herein. In one embodiment, the signal generator 510 may provide a voltage signal depicted in FIGS. 4 and 8 and described below. That is, the signal generator 510 is capable of providing a set of ramping pulses as described below and illustrated in FIGS. 4 and 7. Continuing referring to FIG. 5, in one embodiment, the signal generator 510 may be any of a variety of commercially available systems for generating such voltage signals. The magnitude of the voltage generated by the signal generator 510 may vary depending upon the application. With respect to current-day technology, wherein the operating voltage is on the order of approximately 1-2 volts, the signal generator 510 may generate signals having a voltage that ranges from approximately 4-5 volts. Note that the magnitude of the voltage pulses used in accordance with the present invention is typically higher than the voltage level applied during the constant voltage TDDB testing described in the background section of the application. Moreover, the width of the pulses generated by the signal generator 510 may also vary depending upon the particular application. In general, the width of the pulses will be less than 1 msec. Generally, the lesser the pulse width, the better the resolution of the testing techniques described herein. In one illustrative embodiment, the signal generator 510 may be configured to generate voltage pulses that have a pulse width of approximately 100 ns.

The measurement tool 520 may any of a variety of commercially available devices that are capable of measuring the multiple terminals, e.g., terminals relating to gate current, drain/source current, gate voltage, and/or drain/source voltage of the test device 560. For Example, the measurement tool 520 may be used to measure the gate current after the dielectric layer has been subjected to one or more of the voltage pulses generated by the signal generator 510. Typically, this may be accomplished by using the measurement tool 520 to apply a constant voltage, e.g., 1-2 volts, on the gate electrode and to measure the gate current.

This testing of the gate current is performed very quickly, e.g., on the order of one second for each test. In one particularly illustrative example, the measurement tool 520 may be used to measure the gate current for the test device 560 after each pulse generated by the signal generator 510. However, testing after every stress signal need not be required in all cases. For example, during the early portions of the test, when dielectric breakdown is less likely to occur, the measurement of the gate current may be made less frequently, e.g., after every fourth pulse. Thereafter, as the testing continues, the gate current may be tested more frequently to investigate the soft breakdown phenomenon described previously. Thus, the present invention should not be limited to any particular testing protocol unless such limitations are clearly set forth in the appended claims.

The controller 530 depicted in FIG. 3 controls the operation of the test system 500. To that end, the controller 530 operates the switch 540 between the signal generator 510 and the measurement tool 520 as necessary depending upon the particular testing methodology and protocol selected. For example, in the case where the gate current is measured after every pulse, the controller 530 flips the switch 540 between the signal generator 510 and the measurement tool 520 after predetermined time periods (e.g., after a stress time period), then back again (e.g., after a sense time period) to the signal generator 510 after the gate current, the gate voltage, and/or the drain current are measured by the measurement tool 520. That is, the switch 540 is capable of switching between a stress mode and a sensor mode when performing the TDDB and/or BTI testing. The signal generator 510 is capable of ramping up the voltage at each pulse. The testing mechanism described above is provided for illustrative purposes, and is but one example of a testing system that may be utilized in some embodiments herein.

Figure 4:
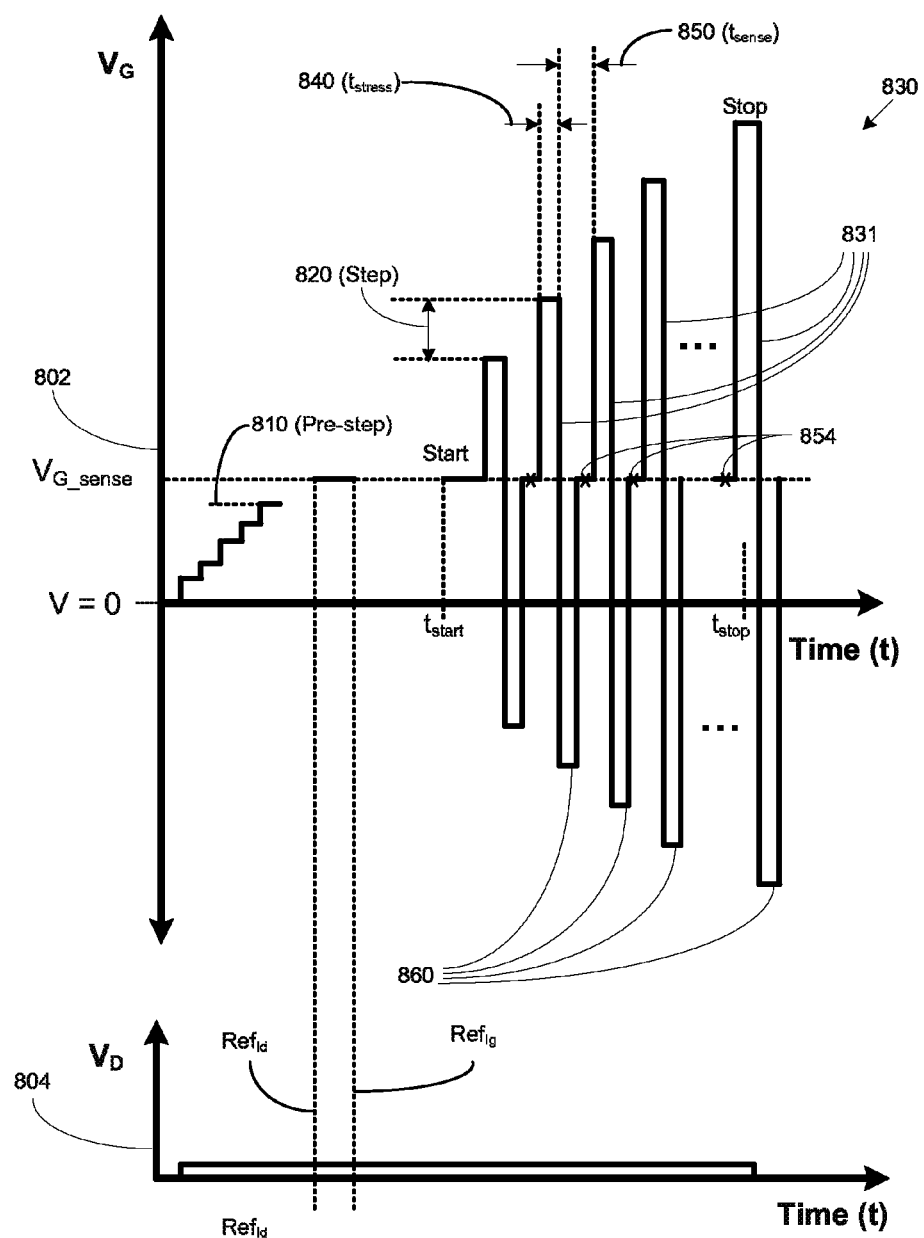
FIG. 4 illustrates an exemplary voltage signal that may be used to perform a dielectric test on a device in accordance with a first embodiment.

FIG. 4 illustrates an exemplary voltage signal that may be used to perform a dielectric test on a device in accordance with a first embodiment. FIG. 4 illustrates two graphs (802 and 804). Graph 802 plots a stress voltage signal 830 applied to the gate of a transistor with respect to time. In one embodiment, the voltage signal 830 may be a VRS signal. However, other types of signals may be used and remain within the spirit and scope of the present invention. Graph 802 plots a stress voltage signal 830 applied to a node on a circuit, e.g., to the gate of a transistor, with respect to time. Graph 804 illustrates the corresponding drain voltage ($V_D$) during that time.

Graph 802 of FIG. 4 shows a voltage signal applied to a circuit node, e.g., the gate, in a step-wise manner, increasing up to the pre-step 810 level. The signal 830 may comprise a stress voltage portion 831 and a recovery voltage portion 860. Prior to starting the stress voltage, a reference drain current ($I_{Id}$) and a reference gate current ($I_{Ig}$) are measured. These reference currents may be compared to actual sensed currents in order to check the threshold integrity. The example of FIG. 4 illustrates that, in one embodiment, the test based on $I_{Id}$ and $I_{Ig}$ may be performed prior to the voltage ramp stress test (i.e., prior to $t_{start}$). In an alternative embodiment, the test based upon $I_{Id}$ and $I_{Ig}$ may be a test that is separate from the voltage ramp stress test. In yet another alternative embodiment, $I_{Id}$ and $I_{Ig}$ may be measured subsequent to the voltage ramp stress test for analysis/testing.

Graph 804 of FIG. 4 relates to sensing linear voltages and currents. For example, when the linear drain current, $I_{dlin}$, and the linear voltage threshold, $V_{Tlin}$, are sensed, the drain voltage $V_D$ (or source voltage ($V_S$), may be held at a low voltage, such as 50 mV, as illustrated in Graph 804.

Substantially simultaneously to performing a test analysis (e.g., BTI analysis), signal 830 contains intermediate monitoring steps for verification of dielectric breakdown as well. The steps in the stress portion 831 of the voltage signal 830 are characterized by a change in voltage of ΔV (step 820) during a time period of ΔT ($t_{stress}$ 840). In one example, the sense time ($t_{sense}$) 850 may be 2 msec. The dielectric breakdown may be determined from monitoring current or stress current versus stress voltage traces during at least a portion of the sense time ($t_{sense}$) 850. During the sense time ($t_{sense}$) 850, a voltage in the opposite polarity of the stress voltage may be applied, i.e., the recovery voltage 860. Each of the recovery voltage 860 portions may be sufficient to substantially negate the charge built-up by the preceding, corresponding stress voltage portion. Accordingly, as the stress voltage portions are ramped to higher and higher levels, the recovery voltage 860 portions are also ramped progressively in the opposite polarity in order to compensate for the charge built-up by each stress portion. The sense time period ($t_{sense}$) of FIG. 4 may be viewed as comprising at least two time-components or periods: a recovery voltage time period and a sensing process time period.

FIG. 5 illustrates a stylized depiction of a portion of the ramping signal for performing a dielectric testing of an integrated device, in accordance with a first embodiment. The stress portion of signal may have a voltage amplitude of +V1 Volts for a time period of $T_1$. To compensate for the charge built-up by the stress portion, in one embodiment, the recovery portion of the signal may have a voltage amplitude of −V1 volts for a time period of $T_1$. Similarly, in the example where the voltage level of the stress portion is −V1 for time period $T_1$, the recovery portion may comprise a voltage level of +V1 for time period $T_1$, for negating the built-up charge during the stress portion. After the recovery voltage is applied, a sensing function is performed at crosshairs 854 (sense).

Figure 6:
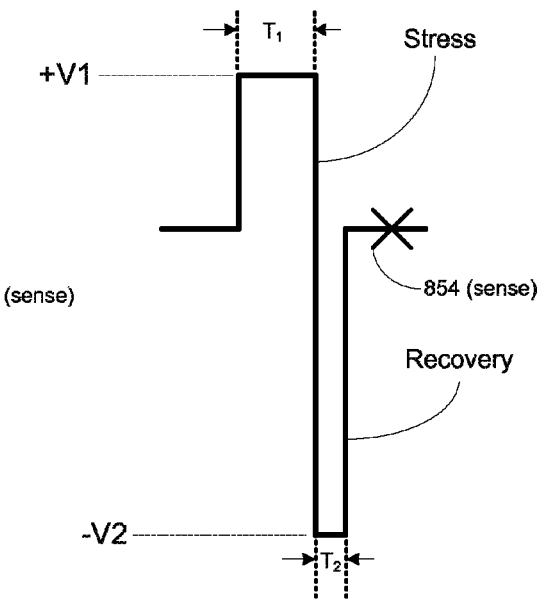
FIG. 6 illustrates a stylized depiction of a portion of the ramping signal for performing a dielectric testing of an integrated device, in accordance with a second embodiment.

FIG. 6 illustrates a stylized depiction of a portion of the ramping signal for performing a dielectric testing of an integrated device, in accordance with a second embodiment. The stress portion of signal in FIG. 6 may have a voltage amplitude of +V1 for a time period of $T_1$. However, a voltage of opposite polarity of a higher magnitude for a smaller amount of time may be sufficient to negate or substantially reduce the built-up charges. In this example, in order to compensate for the charge built-up by the stress portion, in one embodiment, the recovery portion of the signal may have a voltage amplitude of −V2 Volts, which has a higher magnitude as compared to +V1, but is only applied to a smaller or equal time period of $T_2$. Similarly, a smaller recovery voltage magnitude may be used for a longer period of time to achieve the same charge-reduction effect. The time period $T_2$ can be small, equal to, or larger than $T_1$. After the recovery voltage is applied, a sensing function is performed at crosshairs 854 (sense).

Referring back to FIG. 4, the voltage signal 830 the sense time ($t_{sense}$) 850 of the signal 830 provides for applying a recovery voltage 860 and perform a test sensing process, e.g., BTI sensing. That is, the sense time ($t_{sense}$) 850 has two components: a recovery voltage component 860 and a sense component, as denoted by the crosshairs 854. As shown in FIG. 4, a sensing function is performed when the signal reaches the crosshairs 854 at the voltage level gate sense voltage $V_{G\_sense}$.

At the start time $t_{start}$, a stress voltage is provided to a node of the device (e.g., the gate of a transistor), wherein the value of the stress voltage is below, above, or at the sense voltage $V_{G\_sense}$. For example, during testing, the gate of a transistor may be connected to the signal 830, while the source and drain terminals of the transistor are held at ground. During the stress condition, $t_{stress}$ 840, the gate is provided a voltage of a value that is greater than $V_{G\_sense}$. Following a rise in the value of the stress voltage portion 831 of the signal 830 during a stress time period $t_{stress}$ 840, during the subsequent sensing time period $t_{sense}$ 850, the level of the stress voltage is brought back down the sense voltage ($V_{G\_sense}$) level for performing a sensing function. However, prior to the sensing function, a recovery voltage 860 is provided to compensate for the built-up charge caused by the preceding stress voltage. At the time (crosshair 854), a sensing function (e.g., a BTI sensing function) may be performed. In one example, at the crosshair 854, $V_{G\_sense}$ may be the normal threshold gate voltage $V_T$ or a fixed current condition (e.g., 0.4-0.5 Volts). In one embodiment, the drain current, $I_d$, may then be measured. Using knowledge of the impedance of the circuit portion in light of the known dimensions, the test threshold voltage is calculated (based upon the impedance and $I_d$). This calculated threshold voltage may provide an indication of the voltage threshold ($V_T$) shift that has occurred due to the stress voltage 830.

Moreover, in the context of a BTI test process, the BTI test may be performed at one or more elevated temperatures, such as 125° C. Similarly, the linear drain current ($I_{dlin}$), where the drain is trying to turn on, $I_{dsat}$, relating to the "on" current measurement may be measured, and linear voltage threshold, $V_{Tlin}$, and saturation voltage threshold, $V_{Tsat}$, are determined. The shift in the parameters $I_{dlin}$, $I_{dsat}$, $V_{Tlin}$, and $V_{Tsat}$, may be used to characterize the reliability of the device under test.

In light of discharging or negating the built-up charge during the stress portion, stability in the integrated circuit under test may be promoted. Further, excessive charges entering the bandgap are substantially reduced. Further, dissipating the built-up charge may reduce the possibility of a permanent shift of the threshold voltages of transistors. Moreover, applying the dielectric test with the built-up charges being discharged may provide for capturing the impact of opposite charge trapping, thereby enhancing the probability of having correct split signature for dielectric (e.g., BTI) testing.

Those skilled in the art having benefit of the present disclosure would appreciate that within the context of the pulse train signal 830, the dielectric tests are performed during the sense time ($t_{sense}$) 850 intervals. Based upon performing the stress and sense functions, the shift in the threshold voltage of a transistor, as well as the breakdown characteristic of the device (e.g., gate integrity at which point the dielectric fails), may be determined.

Figure 7:
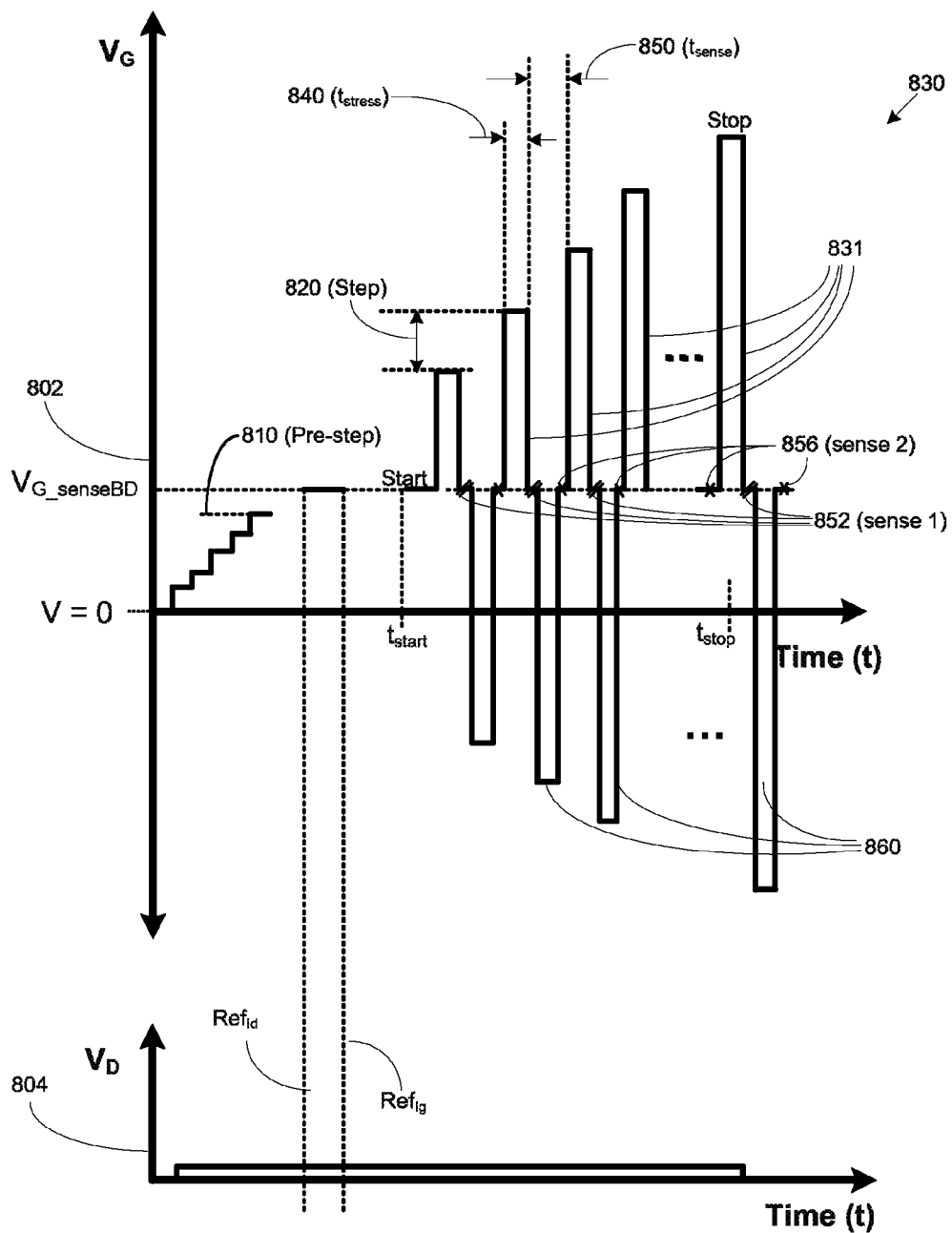
FIG. 7 illustrates an exemplary voltage signal that may be used to perform a dielectric test on a device in accordance with a second embodiment.

FIG. 7 illustrates an exemplary voltage signal that may be used to perform a dielectric test on a device in accordance with a second embodiment. Similar to FIG. 4, FIG. 7 illustrates two graphs (802 and 804), wherein much of the description regarding FIG. 4 apply to FIG. 7. Graph 802 plots a stress voltage signal 830 applied to the gate of a transistor with respect to time. In one embodiment, the voltage signal 830 may be a VRS signal. The signal 830 may comprise a stress voltage portion 831 and a recovery voltage portion 860. However, other types of signals may be used and remain within the spirit and scope of the present invention. Graph 802 of FIG. 7 varies from FIG. 4 in that the sense time ($t_{sense}$) comprises three portions, a sense-1 portion 852, a recovery voltage portion 860, and a sense-2 portion 856, as described below.

The embodiment of FIG. 7 provides for performing a sensing process at sense-1 852, followed by the implementation of a recovery voltage 860 configured to negate or reduce excessive charge built up by the stress voltage during the previous stress time period ($t_{stress}$) 840. After applying the recovery voltage 860, a second sensing process at sense-2 856 may be performed. Thus, the amount of charge dissipated by the recovery voltage 860 may be determined based upon the sense-1 852 and the sense-2 sense 856 measurements. Further, using the dual sensing disclosed herein, processing of semiconductor wafers may be more optimized and better correlations to constant voltage stress can be developed.

Figure 8:
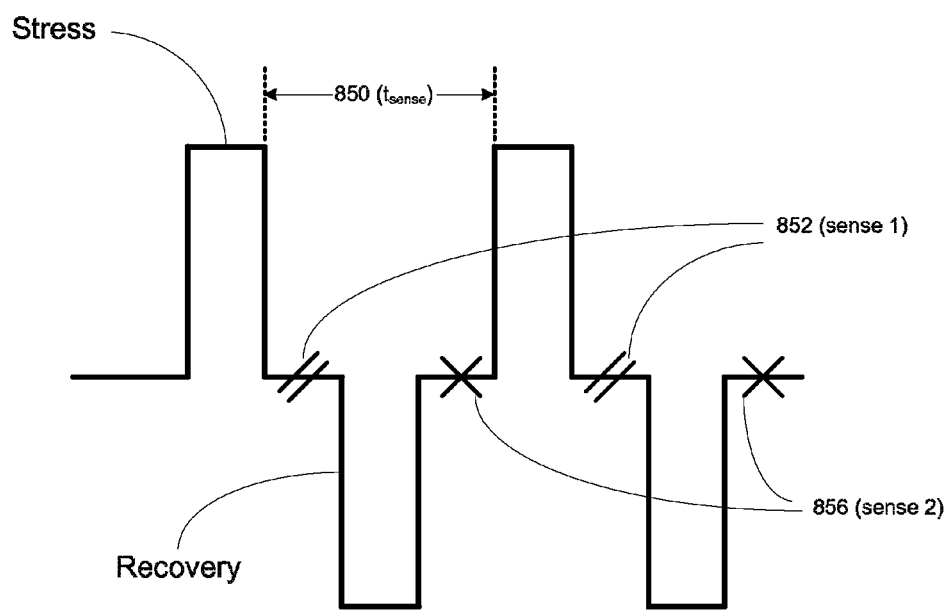
FIG. 8 illustrates a stylized depiction of a portion of the sense time of the signal of FIG. 7.

FIG. 8 illustrates a stylized depiction of a portion of the sense time ($t_{sense}$) of FIG. 7. Referring simultaneously to FIGS. 7 and 8, the sense time ($t_{sense}$) 850 comprises a recovery voltage that is designed to offset/discharge the charges built-up by the immediately preceding stress voltage. In one embodiment, the drain of the transistor under test may be pulsed or can be held constant during dielectric testing. Prior to providing the recovery voltage, a first sense may be performed, at the time indicated by the double-hash marks 852. Subsequent to providing the recovery voltage, a second sense may be performed, at the time indicated by the cross-hash marks 856. Comparing the results of the first and second sensing processes, a determination of the recoverable defects may be made. In this manner a plurality of dielectric testing (e.g., BIT, TDDB, etc.) may be performed. The sense time period ($t_{sense}$) of FIGS. 7 and 8 may be viewed as comprising at least three time components or periods: a first sensing time period, a recovery voltage time period, and a second sensing process time period.

Figure 9:
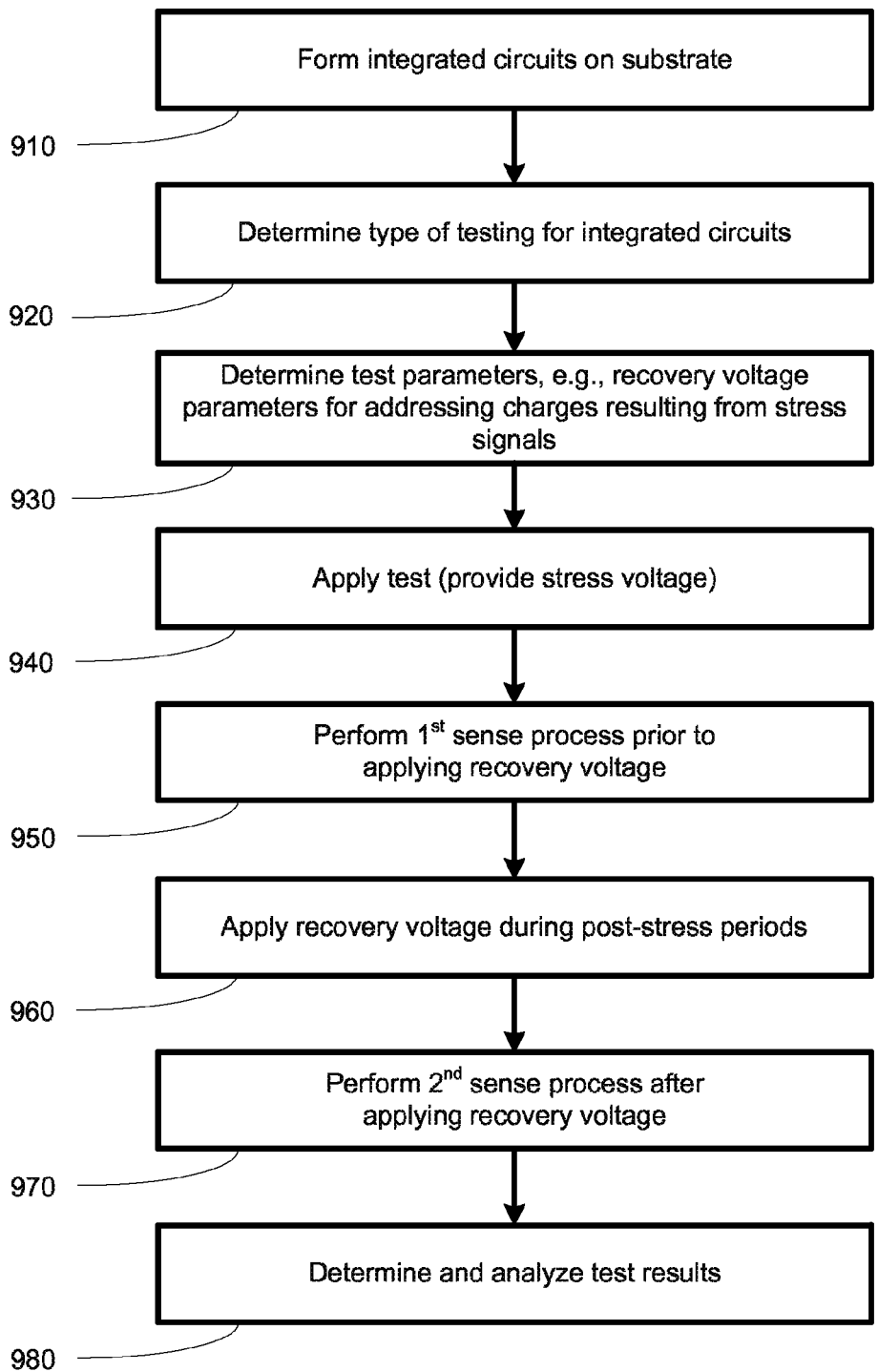
FIG. 9 illustrates a flowchart depiction of performing an integrated circuit testing process in accordance with some embodiments described herein.

Turning now to FIG. 9, a flowchart depiction of performing the integrated circuit testing process in accordance with some embodiments described herein. Integrated circuits may be formed on a substrate (block 910). The integrated circuits may be transistors, processor devices, CMOS technology devices, Flash technology devices, BiCMOS technology devices, power devices, memory devices (e.g., SRAM devices, DRAM devices), NAND memory devices, and/or various other semiconductor devices.

A determination may be made as to the type of testing to be performed on the integrated circuits (block 920). The system 400 may perform one or more dielectric tests, such as a BTI test, a TDDB test, etc. The system 400 may determine various test parameters (block 930). This may include determining the voltage ramping parameters as well as the recovery voltage parameters for addressing charges resulting from stress voltages. The recovery voltage may be designed to comprise a voltage level of the opposite polarity of the stress voltage, and a time period that would provide sufficient energy to dissipate the excessive charge built-up by the stress voltage.

Based upon the test signal parameters, one or more dielectric test may be performed (block 940). Upon applying a stress voltage during a stress period, a first sense process may be performed to measure various test-result parameters (block 950). A recovery voltage may be applied based upon the recovery voltage parameters (e.g., magnitude of the opposite-polarity voltage, duration of the recovery voltage, etc.) (block 960). Subsequently, a second sense process may be performed (block 970). Test results are then determined and analyzed (block 980). The test results may reveal various operational parameters of the integrated circuit under test. These operational parameters may be used to adjust one or more processes of subsequently manufactured devices.

The methods depicted in FIG. 9 and described above may be governed by instructions that are stored in a non-transitory computer readable storage medium and that are executed by, e.g., a processor in a computing device. Each of the operations shown in FIG. 9 may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a device having at least one transistor and at least one dielectric layer;
   providing a first voltage during a first time period for performing a stress test upon said device;
   providing a second voltage during a second time period for discharging at least a portion of the charge built-up as a result of said first voltage, wherein said second voltage is of an opposite polarity of said first voltage;
   performing a sense function during a third time period for determining a result of said stress test; and
   performing at least one of acquiring, storing, or transmitting data relating to a breakdown of said dielectric layer based upon said result of said stress test.

2. The method of claim 1, wherein performing said stress test comprises performing at least on a time dependent dielectric breakdown (TDDB) test or a bias temperature instability (BTI) test.

3. The method of claim 1, wherein performing a sense function during said third time period for determining said result of said stress test comprises determining at least one characteristic of said transistor.

4. The method of claim 1, wherein performing said stress test comprises providing a voltage ramp signal comprising:
   a first stress voltage during a first stress time period;
   a recovery voltage during a recovery time period;
   a sense time period; and
   a second stress voltage during a second stress time, wherein said second stress voltage level is higher than the voltage level of said first stress voltage level by a ramp-step value.

5. The method of claim 1, wherein performing said stress test comprises providing a voltage ramp signal comprising:
   a first stress voltage during a first stress time period;
   a first sense time period;
   a recovery voltage during a recovery time period;
   a second sense time period; and
   a second stress voltage during a second stress time, wherein said second stress voltage level is higher than the voltage level of said first stress voltage level by a ramp-step value.

6. The method of claim 5, further comprising determining at least one recoverable defect based upon a comparison between a first sense function performed during said first sense time, and a second sense function performed during said second sense time.

7. The method of claim 1, wherein determining a result of said stress test comprises determining at least one of a linear drain current, a saturation drain current, a linear gate threshold voltage, or a saturation gate threshold voltage of said transistor.

8. The method of claim 1, wherein said device is comprised of at least one of a transistor, a capacitor, a resistor, memory cell, a CMOS device, a BiCMOS device, a Flash device, a DRAM memory device, and a power device.

9. The method of claim 1, wherein said device is a transistor and said dielectric layer is a gate insulation layer for said transistor.

10. The method of claim 1, further comprising modifying at least one process parameter based said data relating to a breakdown of said dielectric layer, wherein modifying said at least one process parameter comprises modifying at least one of a temperature, a pressure, a duration, a process gas composition, a process gas concentration, and an applied voltage of a process operation.

11. A system, comprising:
a semiconductor device processing system to provide a device comprising at least one transistor and at least one dielectric layer;
a processing controller operatively coupled to said semiconductor device processing system, said processing controller configured to control an operation of said semiconductor device processing system; and
a testing module for providing a voltage ramp signal (VRS) test signal for performing a stress test to determine a breakdown of said dielectric layer and at least one characteristic of said transistor, wherein said test signal comprises:
a first stress voltage during a first stress time period;
a recovery voltage during a recovery time period;
a first sense time period; and
a second stress voltage during a second stress time, wherein said second stress voltage level is higher than the voltage level of said first stress voltage level by a ramp-step value.

12. The system of claim 11, further comprising a second sense time period subsequent to said recovery time period, and wherein said first sense time period is prior to said recovery time period.

13. The system of claim 11, wherein said processing controller is configured to modify at least one process parameter based upon based upon said data relating to a breakdown of said dielectric layer and at least one characteristic of said transistor.

14. The system of claim 11, further comprising:
a testing controller operatively coupled to said testing module, said testing controller configured to control an operation of said testing module; and
a test data analysis unit to perform an analysis of said data relating to the breakdown of said dielectric layer and at least one characteristic of said transistor, said test data analysis unit to provide analysis data to said processing controller for modifying at least one process parameter.

15. The system of claim 11, wherein said stress test comprises at least one of a time dependent dielectric breakdown (TDDB) test or a bias temperature instability (BTI) test.

16. The system of claim 15, wherein the value of the VRS test signal during said TDDB sense period is at least one of a supply voltage level or an intended-use voltage level, and wherein said value of the test signal during said BTI sense period is the gate threshold voltage level of said transistor.

17. The system of claim 16, wherein said testing module comprises:
a pulse generator for generating said test signal, a measurement tool to measure;
a measurement tool to measure at least one of a linear drain current, a saturation drain current, a gate threshold voltage, or a linear gate threshold voltage of said transistor;
a switch to change from said stress mode to said sensor mode; and
a controller to control an operation of at least one of said pulse generator, said measurement tool, and said switch.

18. An apparatus, comprising:
a testing module for providing a voltage ramp signal (VRS) test signal for performing a stress test to determine a breakdown of a dielectric layer and at least one characteristic of a transistor, wherein said test signal comprises a plurality of pulse cycles, wherein each pulse cycle comprises:
a first stress voltage during a first stress time period;
a first sense time period for performing a first sense function;
a discharge voltage that is in an opposite polarity of said first stress voltage during a recovery time period; and
a second sense time period for performing a second sense function.

19. The apparatus of claim 18, wherein said first and second sense function comprises determining at least one of a linear drain current, a saturation drain current, a gate threshold voltage, or a linear gate threshold voltage of said transistor.

20. The apparatus of claim 18, wherein said stress test comprises at least one of a time dependent dielectric breakdown (TDDB) test or a bias temperature instability (BTI) test.

* * * * *